United States Patent
Carpenter

(12)
(10) Patent No.: US 6,407,899 B1
(45) Date of Patent: Jun. 18, 2002

(54) FAULT DETECTION IN A REDUNDANT POWER CONVERTER

(75) Inventor: Brian Ashley Carpenter, Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/520,356

(22) Filed: Mar. 7, 2000

(51) Int. Cl.[7] .............................. H02K 3/14; G05F 1/40
(52) U.S. Cl. ................................. 361/86; 323/282
(58) Field of Search ........................... 361/86, 79, 91.1, 361/89, 91.5

(56) References Cited

U.S. PATENT DOCUMENTS 4,642,807 A * 2/1987 Commroe et al. .......... 714/747
5,982,652 A * 11/1999 Simonelli et al. ........... 363/142
6,097,582 A * 8/2000 Jhon et al. ..................... 361/79

* cited by examiner

*Primary Examiner*—Rajnikant B. Patel
(74) *Attorney, Agent, or Firm*—Joseph A. Sawyer

(57) ABSTRACT

Aspects for detecting faults in a redundant power converter are described. In an exemplary circuit aspect, a circuit for sensing faults in a redundant power converter includes a first voltage level detection mechanism and a second voltage level detection mechanism. The first voltage level detection mechanism detects a voltage level at a predetermined node relative to a first switch gate voltage during a first switch on-time. The second voltage level detection mechanism detects a voltage at the predetermined node relative to a second switch gate voltage during a second switch on-time, wherein a fault is detected when the voltage level violates a threshold level in one of the first voltage level detection mechanism and the second voltage level detection mechanism.

19 Claims, 2 Drawing Sheets

FAULT DETECTION IN A REDUNDANT POWER CONVERTER

FIELD OF THE INVENTION

The present invention relates to voltage regulators, and more particularly, to detecting a fault condition in a voltage regulator.

BACKGROUND OF THE INVENTION

Voltage regulator devices typically maintain terminal voltages of voltage sources within required limits despite variations in input voltages or loads. Industry standard voltage regulators, also known as DC/DC converters, are generally not fault tolerant, thus the output of the regulator goes out of regulation during a fault. Most of the point-of-load power converters in server systems, like the voltage regulator modules (VRMs) for Intel processors, are of the same topology: non-isolated, step-down (buck) converters with synchronous rectification. A basic schematic diagram of a standard buck converter is illustrated in FIG. 1. The distinguishing feature of a synchronous buck converter is that a lower switch S2 is implemented by a diode 10 in parallel with a field effect transistor (FET) 12. Switch S2 and a high-side switch S1, formed by a FET 14, are controlled in a complementary fashion, such that either one or the other switch, but not both switches, is ON, except for a small 'dead-time' provided by a control unit 18, when only the diode 10 conducts. Efficiency is achieved by the arrangement, because the losses of existing FET devices are generally better than those of existing diode devices. The arrangement further allows current to flow through S2 in reverse, and thus synchronous converters can regulate down to zero DC load.

Synchronous switching regulators have drive signals for the switches 12 and 14. A switching node, V1, acts as a summing point of switches S1, S2, and inductor 19 (L1). Under normal operations, the voltage at V1 is a trapezoidal waveform, which is HIGH when S1 is ON and LOW when S2 is ON. The waveform at V1 is then chopped down by a filter formed by the inductor 19 and a capacitor 21 (C1). In order to keep the output voltage ripple at low levels required by the load, e.g., a CPU, the corner frequency of the L1–C1 filter is usually kept at least 10 times lower in frequency than the minimum switching frequency of the converter.

Faults in a voltage regulator can be problematic and are usually not detected until the regulator goes out of tolerance by a fault detection device coupled to the output of the regulator. "Up-time" is becoming increasingly important in servers as the servers take on tasks once performed by ultra-reliable mainframes. Redundancy is the typical method used to achieve a high degree of basic reliability in servers. FIG. 2 illustrates a plurality of redundant voltage regulator modules 20. VRM1 to VRMn, which are coupled in parallel to a sensitive load device 22, e.g., a CPU, such that if one VRM 20 goes down,. another VRM takes over. Without fault detection hooks to sense failures in redundant elements and a way in which to report them, however, redundancy is significantly less useful.

The failure of a high-side switch S1 is particularly common and troublesome, since the failure results in an overvoltage on the output. In standard VRMs, a separate independent crowbar, which blows the input fuse, is often utilized. Unfortunately, for parallel converter arrangements, the output voltage goes out of regulation before the circuit acts (i.e., blows a fuse), and there is no guarantee that the fuse will blow in a faulty VRM before the fuse blows in a non-faulty VRM.

Accordingly, what is needed is a method and system for detecting faults in a voltage regulator module before the output voltage goes out of regulation.

SUMMARY OF THE INVENTION

The present invention provides aspects for detecting faults in a redundant power converter. In an exemplary circuit aspect, a circuit for sensing faults in a redundant power converter includes a first voltage level detection mechanism and a second voltage level detection mechanism. The first voltage level detection mechanism detects a voltage level at a predetermined node relative to a first switch gate voltage during a first switch on-time. The second voltage level detection mechanism detects a voltage at the predetermined node relative to a second switch gate voltage during a second switch on-time, wherein a fault is detected when the voltage level violates a threshold level in one of the first voltage level detection mechanism and the second voltage level detection mechanism.

Through the present invention, fault conditions in both high side and low side switches in redundant voltage regulators are detected in an efficient and effective manner. Improved redundant power converter operation results, since faults can be detected before an overvoltage situation occurs. These and other advantages of the aspects of the present invention will be more fully understood in conjunction with the following detailed description and accompanying drawings.

DETAILED DESCRIPTION OF THE INVENTION

The present invention relates to detecting fault conditions in a voltage regulator. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be merely limited to the embodiment shown but is to be accorded the widest scope consistent with the principles and features described herein.

Figure 1:
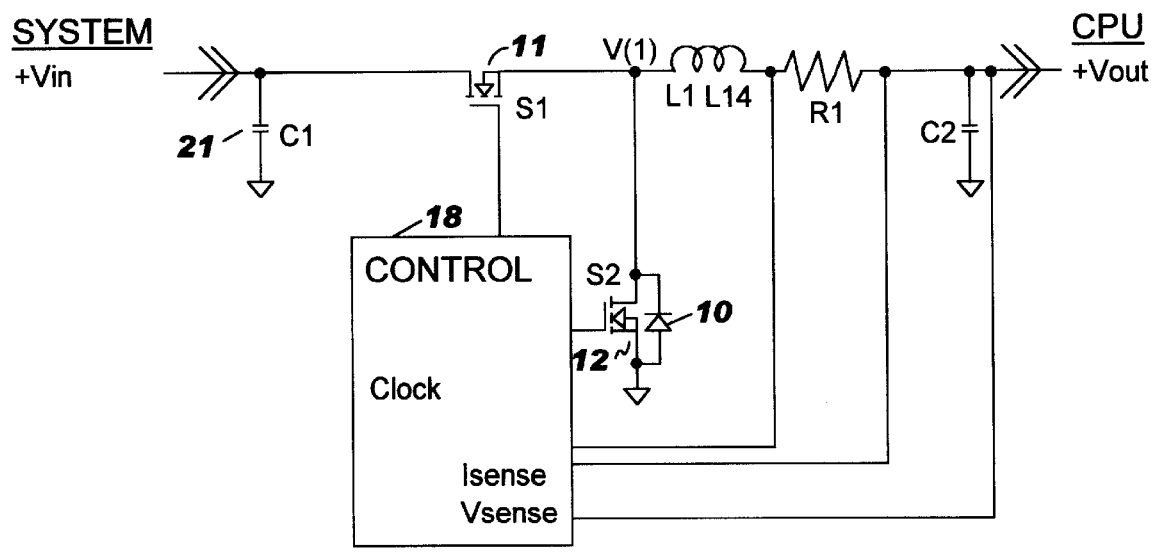
FIG. 1 illustrates a prior art diagram of a voltage regulator.
Figure 2:
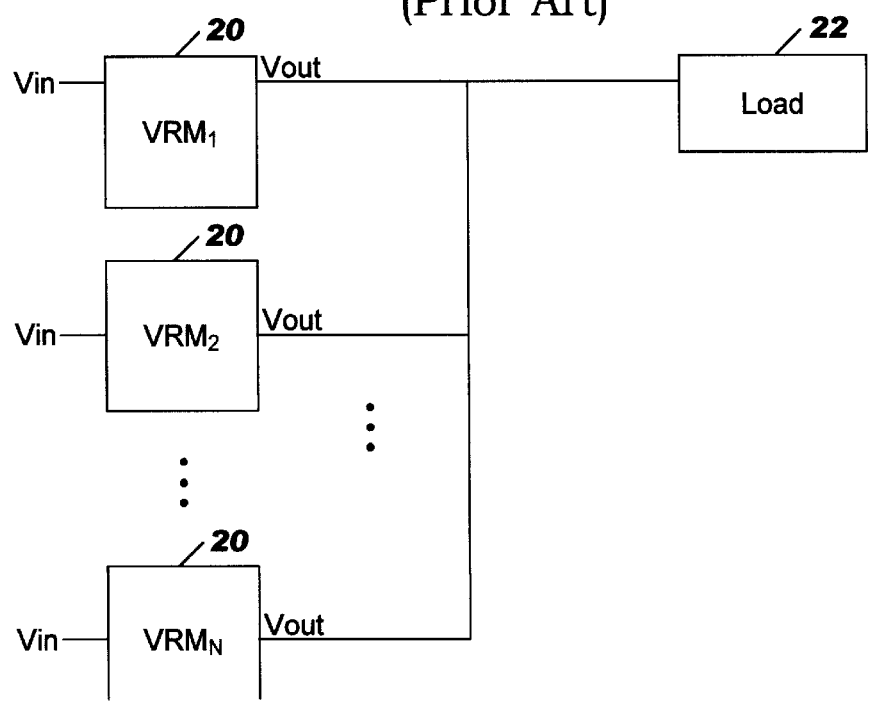
FIG. 2 illustrates a prior art arrangement of redundant voltage regulators.

A number of conditions may arise in a voltage regulator that results in a fault. As mentioned previously, typical regulators are limited due to fault condition identification only when the output voltage goes out of tolerance ranges. Referring to the regulator of FIG. 1, fault conditions include S1 shorted or open, S2 shorted, control unit 18 drive failure in S1 (i.e., drive HIGH or drive LOW), and control unit 18 drive failure in S2 (i.e., drive HIGH only, LOW drive is not detected because of the presence of the diode 10, in which case the converter continues to operate but with reduced efficiency). In order to capably diagnose such fault conditions before the voltage goes out of regulation, fault detection/protection is provided, as illustrated by the circuit diagram in FIG. 3.

During normal operation of the VRM, the current in S2 flows backward to the normal convention, i.e., the current flows from source to drain, due to the inductor 19. As a result, the voltage at V1 is negative with respect to ground during the period S2 conducts (i.e., during S2 on-time). Even at zero load, the voltage at $V1=-\frac{1}{2}*R_{dS(S2)}* I1$, where $R_{dS(S2)}$ represents the resistance from drain to source of switch S2. Therefore, when the voltage at V1 is found to be positive during the time that switch S2 conducts, then a fault condition exists, because the current can only come from either a faulted switch S1 (which should not be ON and thus is faulted) or from the output, which can occur if switch S2 is shorted.

Figure 3:
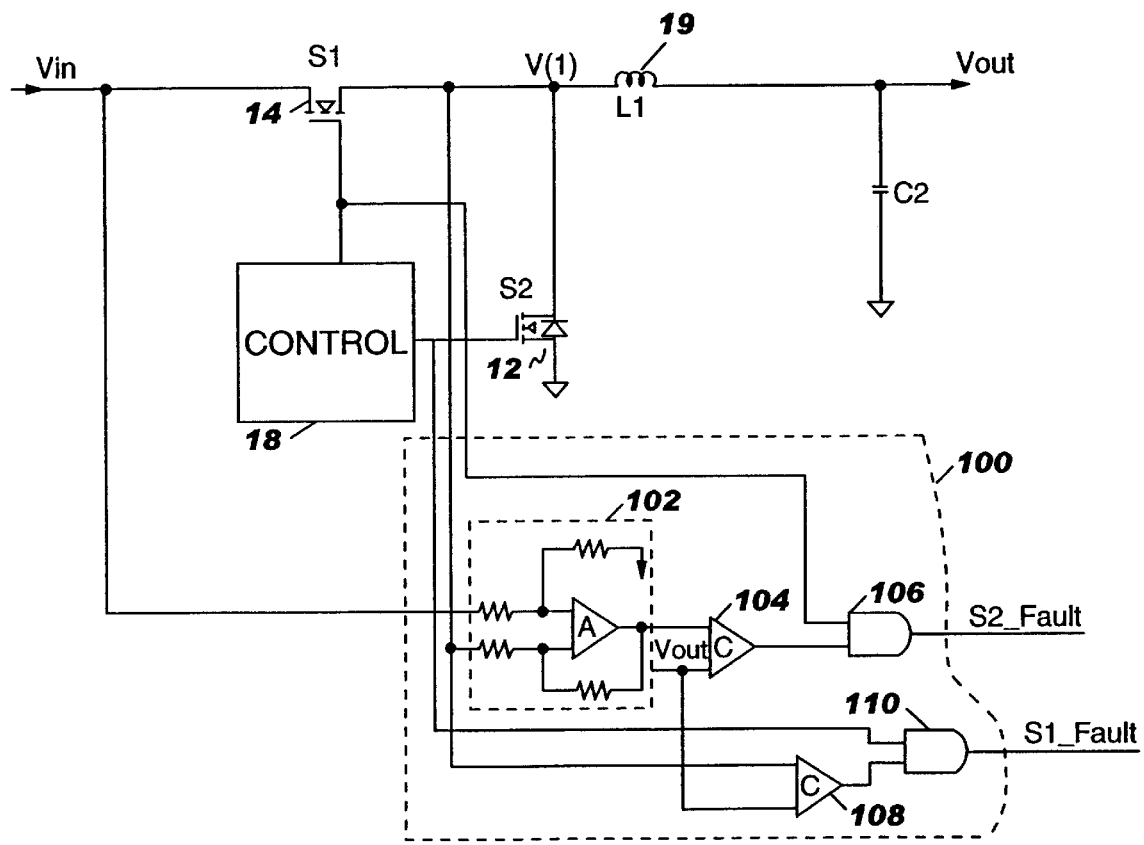
FIG. 3 illustrates a fault detection and protection circuit in accordance with the present invention.

The VRM shown in FIG. 3 includes circuitry for detecting a fault condition in accordance with the present invention. It should be appreciated that although the present invention is described with reference to circuitry external to the base control unit 18, the circuitry described may be implemented as an embedded part of the control unit 18 to provide a single package solution. Alternatively, a digital processor, such as that which may be used to report faults, could also be programmed to perform the fault detection function.

Referring to FIG. 3, a fault detection circuit 100 is illustrated that detects both S1 and S2 fault conditions. Detecting an S2 short is capably performed by measuring V1 during the S1 ON-time. If (Vin–V1) is not a very low value, then S2 is shorted. By way of example, an S2 short has been shown to pull V1 from an expected level of 12 volts (V) to under 5V in an arrangement of a dual VRM circuit design. Thus, differential amplifier circuit 102 performs the function of (Vin–V1) for comparison via a level detector comparator 104 that is biased with a fixed reference voltage (e.g., 2.5 volts). The resulting signal from comparator 104 is logically combined with the S1 gate signal via logic gate (NAND) 106 to determine the level of an S2_Fault signal. To implement S1 fault detection, the fault detection circuit 100 includes a positive level detector, implemented as a comparator 108 that is biased with the fixed reference voltage (e.g., 2.5 volts) and gated with the S2 gate signal via logic gate (NAND) 110 to detect whether a positive voltage exists at V1 during S2 on-time.

Once detected, isolation of a regulator having a fault condition is achieved in accordance with fault isolation techniques, as described in co-pending U.S. patent application, Ser. No. 09/181,124, entitled FAULT ISOLATION IN A REDUNDANT POWER CONVERTER, filed on Oct. 28, 1998, and assigned to the assignee of the present invention.

Through the present invention, fault conditions in both high side and low side switches in redundant voltage regulators are detected in an efficient and effective manner. Further, the present invention performs the fault detection without requiring start-up and fault recovery blanking circuitry.

Although the present invention has been described in accordance with the embodiments shown, one of ordinary skill in the art will readily recognize that there could be variations to the embodiments and those variations would be within the spirit and scope of the present invention. For example, to further enhance the fault detection of the present invention, a 'no gate drive' detection circuit, such as a missing pulse detector, can be added. The output of this additional detection circuit could be logically combined, e.g., via an OR gate, with the fault detection output of the described inventive circuit. Accordingly, many modifications may be made by one of ordinary skill in the art without departing from the spirit and scope of the appended claims.

What is claimed is:

1. A method of sensing faults in a redundant power converter, the method comprising the steps of:
    (a) monitoring a voltage level at a predetermined node within a power converter during an on-time of first and second switches of the power converter, where the predetermined node further comprises a summing node within the power converter for the first and second switches and an inductor; and
    (b) detecting a fault condition in the power converter based upon a comparison between the voltage level and a reference voltage level.

2. The method of claim 1 wherein the step (a) of monitoring further comprises (a2) monitoring for a positive voltage level to detect a short circuit in the first switch during the on-time of the second switch.

3. The method of claim 2 wherein the step (a) of monitoring further comprises (a3) monitoring for a difference value between an input voltage and the voltage level that violates a threshold voltage to detect a fault in the second switch during the on-time of the first switch.

4. The method of claim 1 wherein the step (b) of detecting further comprising (b1) detecting a low level output from a NAND gate.

5. A circuit for sensing faults in a redundant power converter, the circuit comprising:
    a first voltage level detection means for detecting a voltage level at a predetermined node relative to a first switch gate voltage during a first switch on-time; and
    a second voltage level detection means for detecting a voltage at the predetermined node relative to a second switch gate voltage during a second switch on-time, wherein a fault is detected when the voltage level violates a threshold level in one of the first voltage level detection means and the second voltage level detection means.

6. The circuit of claim 5 wherein the first voltage level detection means further comprises a comparison means with an output coupled to a logic gate.

7. The circuit of claim 6 wherein the logic gate further comprises a NAND gate.

8. The circuit of claim 6 wherein the comparison means compares a difference value between an input voltage level and the voltage at the predetermined node to the threshold level.

9. The circuit of claim 6 wherein the logic gate logically combines the output of the comparison means with the first switch gate voltage.

10. The circuit of claim 5 wherein the second voltage level detection means further comprises a comparison means coupled at an output to a logic means.

11. The circuit of claim 10 wherein the comparison means compares the threshold level with the voltage at the predetermined node.

12. The circuit of claim 10 wherein the logic means logically combines the output of the comparison means with the second switch gate voltage.

13. The circuit of claim 12 wherein the logic means further comprises a NAND gate.

14. A redundant power converter with fault detection capability, the redundant power converter comprising:
    a control unit;
    first and second switches coupled at a summing node and to the control unit; and
    fault detection circuit coupled to the summing node and to the first and second switches, the fault detection circuit monitoring the summing node for fault detection based on a comparison between a voltage level at the summing node and gate voltage levels of the first and second switches during one of a first switch on-time and a second switch on-time.

15. The redundant power converter of claim 14 wherein the fault detection circuit further comprises:
   a first voltage level detection means for detecting the voltage level at the summing node relative to a first switch gate voltage during the first switch on-time; and
   a second voltage level detection means for detecting the voltage at the summing node relative to a second switch gate voltage during the second switch on-time, wherein a fault is detected when the voltage level violates a threshold level in one of the first voltage level detection means and the second voltage level detection means.

16. The redundant power converter of claim 15 wherein the first voltage level detection means further comprises a comparison means for comparing a difference value between an input voltage level and the voltage at the summing node to the threshold level and with an output coupled to a logic means for logically combining the output of the comparison means with the first switch gate voltage.

17. The redundant power converter of claim 15 wherein the second voltage level detection means further comprises a comparison means for comparing the threshold level with the voltage at the summing node and with an output coupled to a logic means for logically combining the output of the comparison means with the second switch gate voltage.

18. The redundant power converter of claim 14 wherein the summing node further comprises a node within the power converter shared by the first and second switches and an inductor.

19. The redundant power converter of claim 14 wherein the control unit comprises the fault detection circuit as embedded logic.

* * * * *